(12) United States Patent
Tu

(10) Patent No.: US 8,791,475 B2
(45) Date of Patent: Jul. 29, 2014

(54) LIGHT-EMITTING DIODE

(75) Inventor: Chuan-Cheng Tu, Taipei (TW)

(73) Assignee: RGB Consulting Co., Ltd., Tainan (TW)

( * ) Notice: Subject to any disclaimer, the term of this patent is extended or adjusted under 35 U.S.C. 154(b) by 32 days.

(21) Appl. No.: 13/153,126

(22) Filed: Jun. 3, 2011

(65) Prior Publication Data

US 2012/0181546 A1 Jul. 19, 2012

(30) Foreign Application Priority Data

Jan. 17, 2011 (TW) .............................. 100101675 A

(51) Int. Cl.
*H01L 29/205* (2006.01)
*H01L 33/38* (2010.01)

(52) U.S. Cl.
CPC ................................. *H01L 33/382* (2013.01)
USPC ............... 257/91; 257/E33.062; 257/E33.065

(58) Field of Classification Search
CPC .................................................... H01L 33/382
USPC ........................... 257/99, E33.062, E33.065; 372/46.01–46.016
See application file for complete search history.

(56) References Cited

U.S. PATENT DOCUMENTS

| | | | | |
|---|---|---|---|---|
| 6,797,988 B2* | 9/2004 | Lin et al. | .......................... | 257/98 |
| 2003/0038294 A1* | 2/2003 | Sano | ................................ | 257/91 |
| 2009/0001402 A1* | 1/2009 | Sakai | ............................... | 257/99 |
| 2009/0250685 A1* | 10/2009 | Moon | .............................. | 257/13 |

* cited by examiner

*Primary Examiner* — Colleen Matthews
*Assistant Examiner* — Christopher Johnson
(74) *Attorney, Agent, or Firm* — Muncy, Geissler, Olds & Lowe, P.C.

(57) ABSTRACT

A light-emitting diode includes a first electrode, a conductive substrate layer, a reflective layer, a first electrical semiconductor layer, a active layer, a second electrical semiconductor layer, and at least one second electrode. The conductive substrate layer is formed on the first electrode. The reflective layer is formed on the conductive substrate layer. The first electrical semiconductor layer is formed on the reflective layer. The active layer is formed on the first electrical semiconductor layer. The second electrical semiconductor layer is formed on the active layer. The at least one second electrode is formed on the second electrical semiconductor layer. At least one third electrode is additionally disposed under the second electrical semiconductor layer. At least one connection channel is disposed between the second electrode and the third electrode, so that the second electrode and the third electrode are electrically connected.

10 Claims, 6 Drawing Sheets

LIGHT-EMITTING DIODE

BACKGROUND OF THE INVENTION

1. Field of Invention

The present invention relates to a high luminous and high power light-emitting diode (LED) capable of effectively improving lumens per watt (lm/W) while maintaining a high light-emitting efficiency.

2. Related Art

In recent years, high luminous LEDs made of nitride or phosphide materials have been developed, which can emit red, blue, green lights and may also be used to produce all colors of lights and the white light. For instance, the GaN-based semiconductor is a compound semiconductor material applicable to emitting a blue light and a UV light. The currently used LEDs may be classified into planar LEDs and vertical LEDs. The p-type and n-type electrodes of a planar LED are located at the upper part and facing the same direction, so this LED device needs a quite large size for obtaining a sufficient light-emitting area. Moreover, the p-type electrode is close to the n-type electrode, and thus the LED may be easily influenced by the electrostatic discharge (ESD). However, the p-type and the n-type electrodes of the vertical LED are formed opposite to each other and with an epitaxial layer sandwiched therebetween, so the deficiencies of the planar LED can be solved.

However, regarding the conventional vertical LED, the semiconductor material layer has a poor conductivity, so the current cannot be effectively and uniformly spread to the entire active layer from the contacts. Therefore, the density of current may be too high in some local areas inside the LED, which adversely affects the overall luminance and even worse results in that the local area around the active layer gets deteriorated earlier than expected, thus greatly reducing the lifespan and further influencing the light-emitting efficiency of the LED.

Therefore, a vertical LED device has been developed, as shown in FIGS. 1 and 1A. One or more rectangular metal electrodes c may be disposed in parallel on the surface of an epitaxial structure b of the LED by means of evaporating or electroplating and then are packaged to form the vertical LED device. Although the vertical LED device has an enhanced current spreading performance and improved light-emitting uniformity, the improvement on the light-emitting efficiency is still limited.

SUMMARY OF THE INVENTION

The primary object of the present invention is to provide a high luminous and high power LED capable of effectively improving lm/W while maintaining a high light-emitting efficiency.

To achieve the above objectives, the LED of the present invention includes a first electrode, a conductive substrate layer, a reflective layer, a first electrical semiconductor layer, an active layer, a second electrical semiconductor layer, and at least one second electrode. The conductive substrate layer is formed on the first electrode. The reflective layer is formed on the conductive substrate layer. The first electrical semiconductor layer is formed on the reflective layer. The active layer is formed on the first electrical semiconductor layer. The second electrical semiconductor layer is formed on the active layer. The at least one second electrode is formed on the second electrical semiconductor layer. At least one third electrode is disposed under the second electrical semiconductor layer and at least one connection channel is disposed between the second electrode and the third electrode, so that the second electrode and the third electrode are electrically connected.

In practice, the number of the second electrode on the second electrical semiconductor layer and the number of the third electrode under the second electrical semiconductor layer are the same, each third electrode is correspondingly disposed under each second electrode and a connection channel is disposed between the second electrode and the third electrode.

In practice, the total area of the second electrode on the second electrical semiconductor layer is smaller than the total area of the third electrode under the second electrical semiconductor layer.

In practice, the total area of the second electrode is smaller than the area of the second electrical semiconductor layer.

In practice, the third electrode under the second electrical semiconductor layer is overlapped by an insulating layer so as to be isolated from the first electrical semiconductor layer and the reflective layer.

In practice, the material of the conductive substrate layer is at least one selected from a group consisting of Cu, Al, Ni, Mo, W, Ti, Ag, Au, Co, Ta, W, Sn, In and an alloy thereof.

In practice, the material of the conductive substrate layer is at least one selected from a group consisting of Si, Ge, GaP, SiC, GaN, AlN, GaAs, InP, AlGaAs and ZnSe.

In practice, the material of the active layer is at least one selected from a group consisting of AlInGaN, InGaN, GaN, AlGaInP, InGaP, GaAs, InGaAs, InP and AlGaAs.

In practice, the material of the reflective layer is at least one selected from a group consisting of Ag, Al, Au, Rh, Pt, Cu, Ni, W, In, Pd, Zn, AlSi, Ni/Ag/Ni/Au, Ag/Ni/Au, Ag/Ti/Ni/Au, Ti/Al, Ni/Al, Ni/Ag and an alloy thereof.

In practice, the material of the second electrode and the third electrode is at least one selected from a group consisting of Cr/Au, Cr/Al, Cr/Pt/Au, Cr/Ni/Au, Cr/Al/Pt/Au, Cr/Al/Ni/Au, Al, Ti/Al, Ti/Au, Ti/Al/Pt/Au; Ti/Al/Ni/Au, Al/Pt/Au, Al/Ni/Au, Al/W/Au, Ti/Al/Ti/Au, Ti/Pt/Al/Ti/Au, Ti/Pt/Al/Cr/Au, Ti/Al/Ti/Pt/Au, Ti/Al/Cr/Pt/Au and an alloy thereof.

In practice, the second electrode and the third electrode are made of the same material.

In practice, the first electrical semiconductor layer is of p-type and the second electrical semiconductor layer is of N-type.

In practice, a bonding layer is disposed between the conductive substrate layer and the reflective layer, and the components of the bonding layer at least contain one of Au, AuIn and AuSn.

Other objects, advantages and novel features of the present invention will become more apparent from the following detailed description when taken in conjunction with the accompanying drawings.

DETAILED DESCRIPTION OF THE INVENTION

Figure 1:
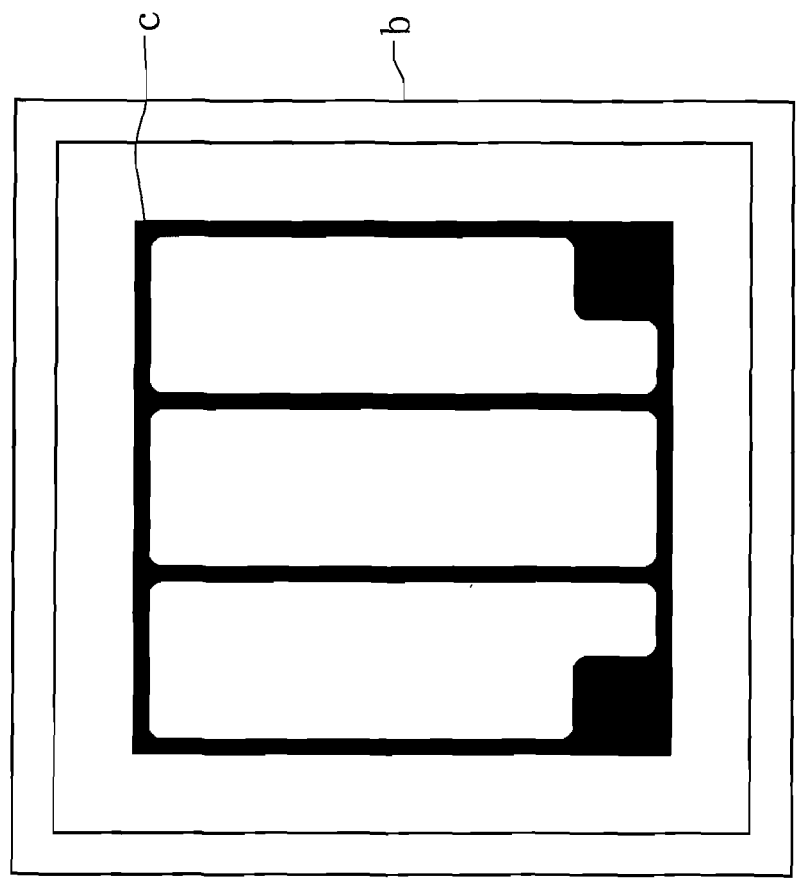
FIG. 1 is a top view of a vertical LED in the prior art.
Figure 1A:
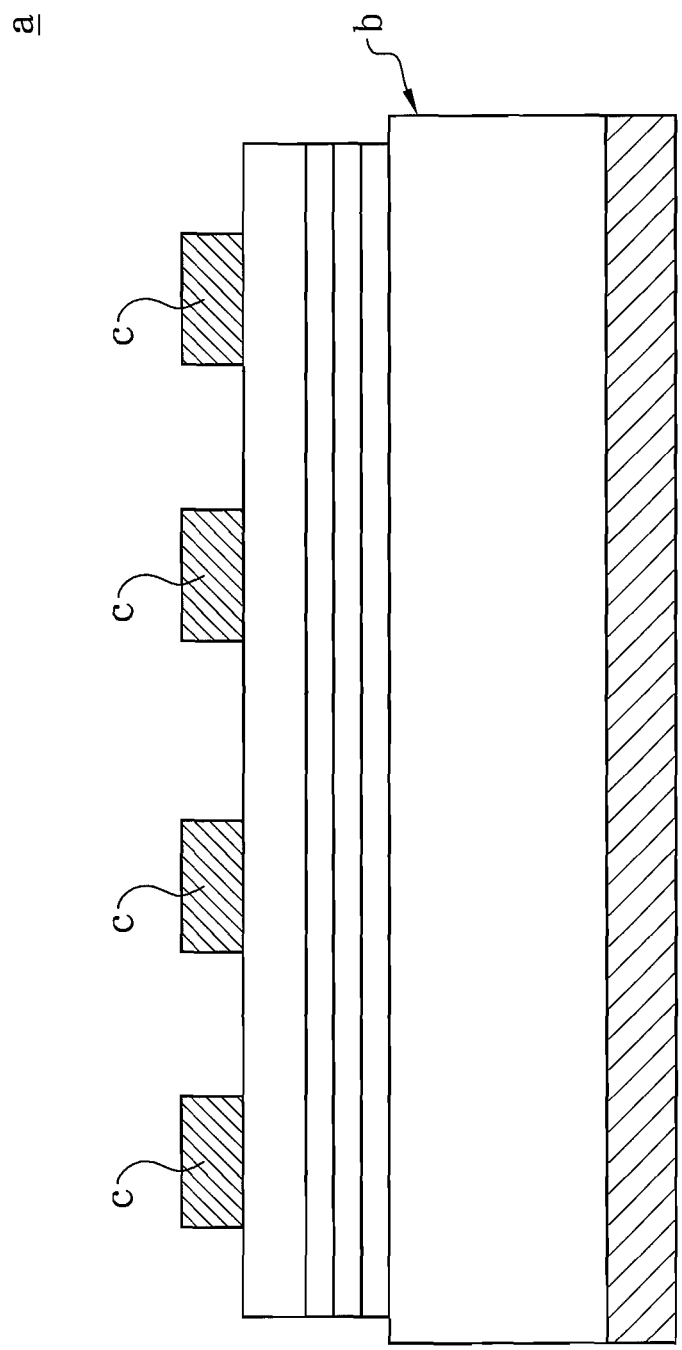
FIG. 1A is a cross-sectional view of a vertical LED in the prior art.
Figure 2:
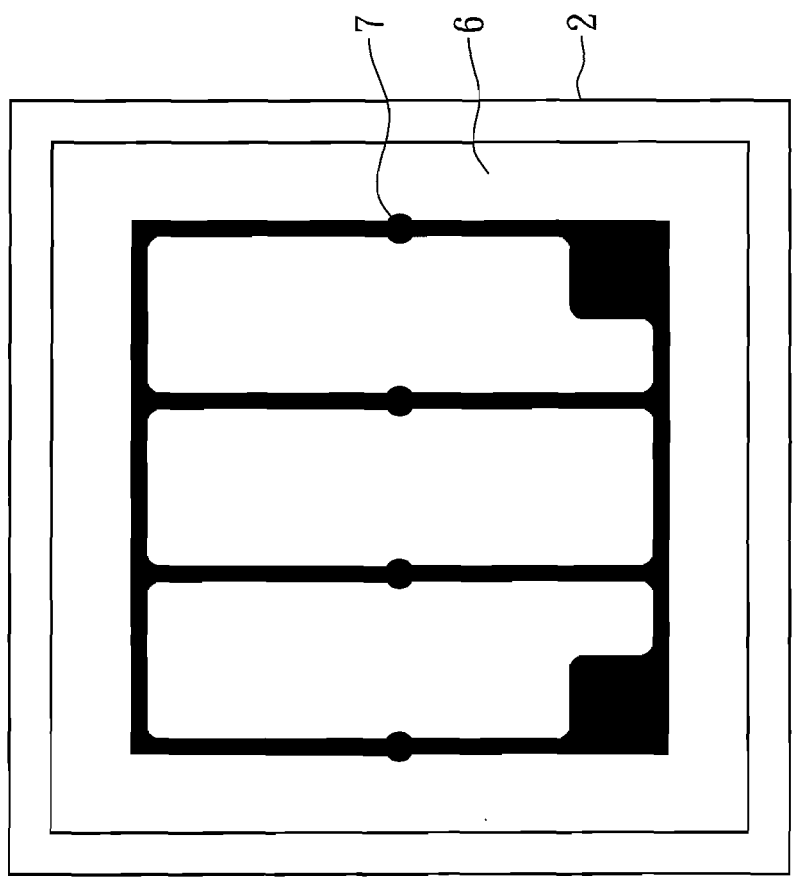
FIG. 2 is a top view of an LED according to the present invention.
Figure 2A:
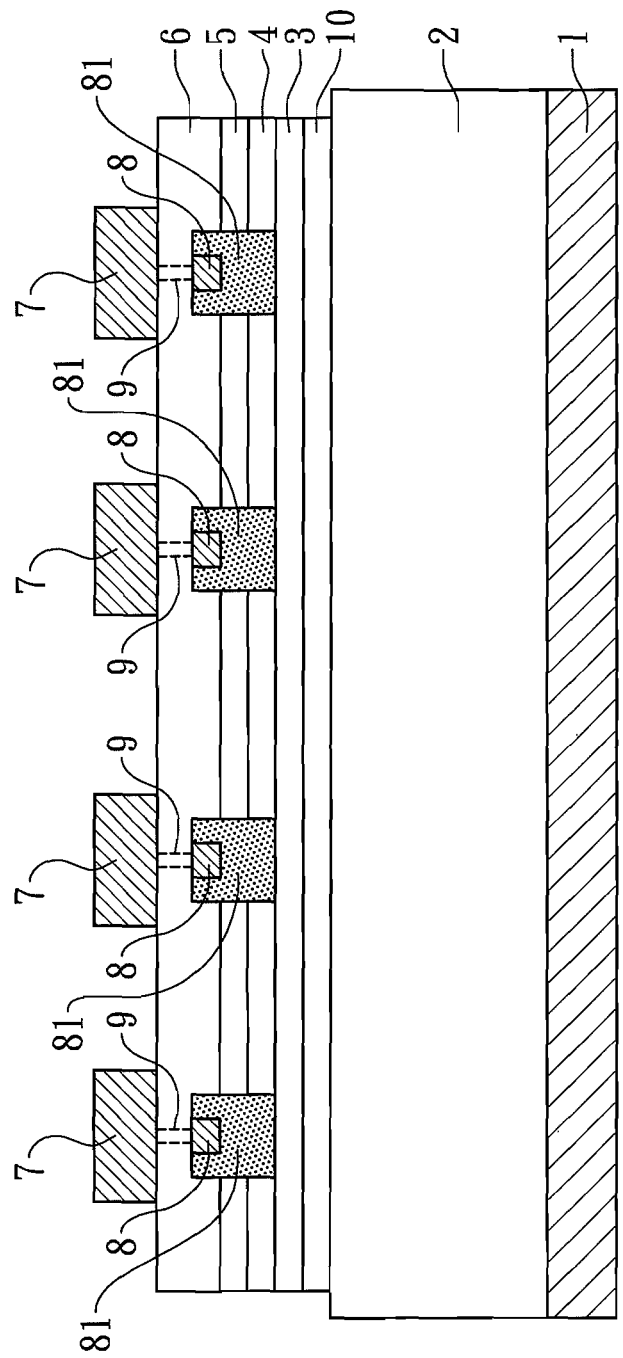
FIG. 2A is a cross-sectional view of the LED according to the present invention.

Referring to FIGS. 2 and 2A, an LED according to an embodiment of the present invention includes a first electrode 1, a conductive substrate layer 2, a reflective layer 3, a first electrical semiconductor layer 4, an active layer 5, a second electrical semiconductor layer 6, and at least one second electrode 7.

The conductive substrate layer 2 is formed on the first electrode 1. The material of the conductive substrate layer 2 is at least one selected from a group consisting of Cu, Al, Ni, Mo, W, Ti, Ag, Au, Co, Ta, W, Sn, In and an alloy thereof, or is at least one selected from a group consisting of Si, Ge, GaP, SiC, GaN, AlN, GaAs, InP, AlGaAs and ZnSe. The reflective layer 3 is formed on the conductive substrate layer 2. The material of the reflective layer 3 is at least one selected from a group consisting of Ag, Al, Au, Rh, Pt, Cu, Ni, W, In, Pd, Zn, AlSi, Ni/Ag/Ni/Au, Ag/Ni/Au, Ag/Ti/Ni/Au, Ti/Al, Ni/Al, Ni/Ag and an alloy thereof. The first electrical semiconductor layer 4 is formed on the reflective layer 3. The active layer 5 is formed on the first electrical semiconductor layer 4. The material of the active layer 5 is at least one selected from a group consisting of AlInGaN, InGaN, GaN, AlGaInP, InGaP, GaAs, InGaAs, InP and AlGaAs. The second electrical semiconductor layer 6 is formed on the active layer 5. The at least one second electrode 7 is formed on the second electrical semiconductor layer 6. At least one third electrode 8 is disposed under the second electrical semiconductor layer 6. In this embodiment, for example, the number of the second electrode 7 on the second electrical semiconductor layer 6 and the number of the third electrode 8 under the second electrical semiconductor layer 6 are the same. Each third electrode 8 is correspondingly disposed under each second electrode 7 and a connection channel 9 is disposed between the second electrode 7 and the third electrode 8, so that the each second electrode 7 and the third electrode 8 are electrically connected, and the third electrode 8 is overlapped by an insulating layer 81 so as to be isolated from the first electrical semiconductor layer 4 and the reflective layer 3, thereby reducing the operating voltage of the LED and improving lm/W. The material of the second electrode 7 and the third electrode 8 is at least one selected from a group consisting of Cr/Au, Cr/Al, Cr/Pt/Au, Cr/Ni/Au, Cr/Al/Pt/Au, Cr/Al/Ni/Au, Al, Ti/Al, Ti/Au, Ti/Al/Pt/Au; Ti/Al/Ni/Au, Al/Pt/Au, Al/Ni/Au, Al/W/Au, Ti/Al/Ti/Au, Ti/Pt/Al/Ti/Au, Ti/Pt/Al/Cr/Au, Ti/Al/Ti/Pt/Au, Ti/Al/Cr/Pt/Au and an alloy thereof, and the material of the second electrode 7 and the third electrode 8 may also be the same. A bonding layer 10 is disposed between the conductive substrate layer 2 and the reflective layer 3, and the components of the bonding layer 10 at least contain one of Au, AuIn and AuSn.

Figure 3:
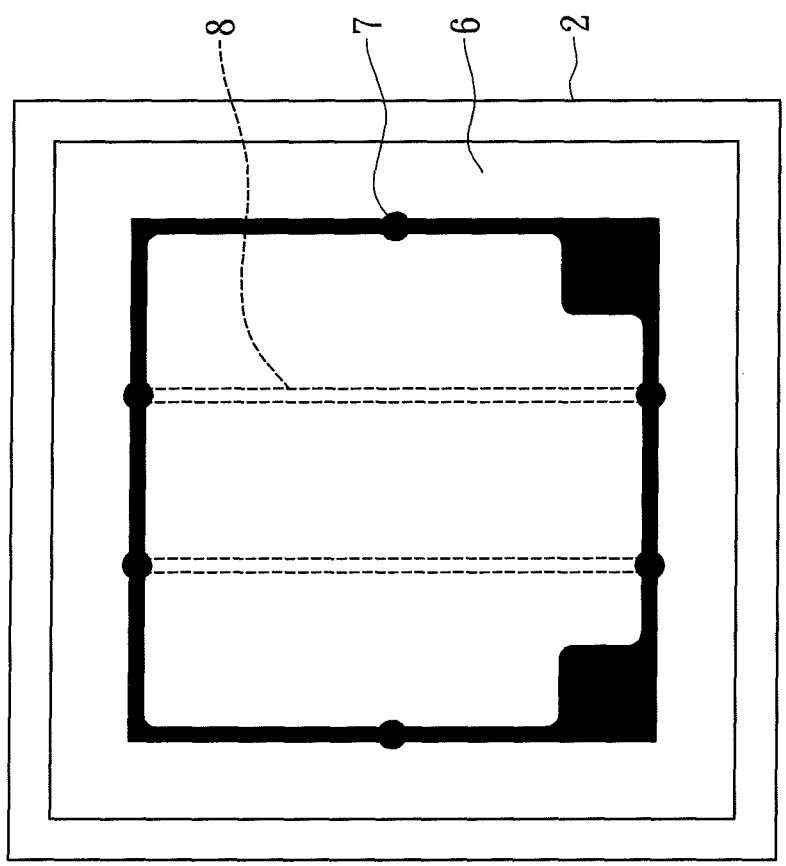
FIG. 3 is a top view of another embodiment according to the present invention.
Figure 3A:
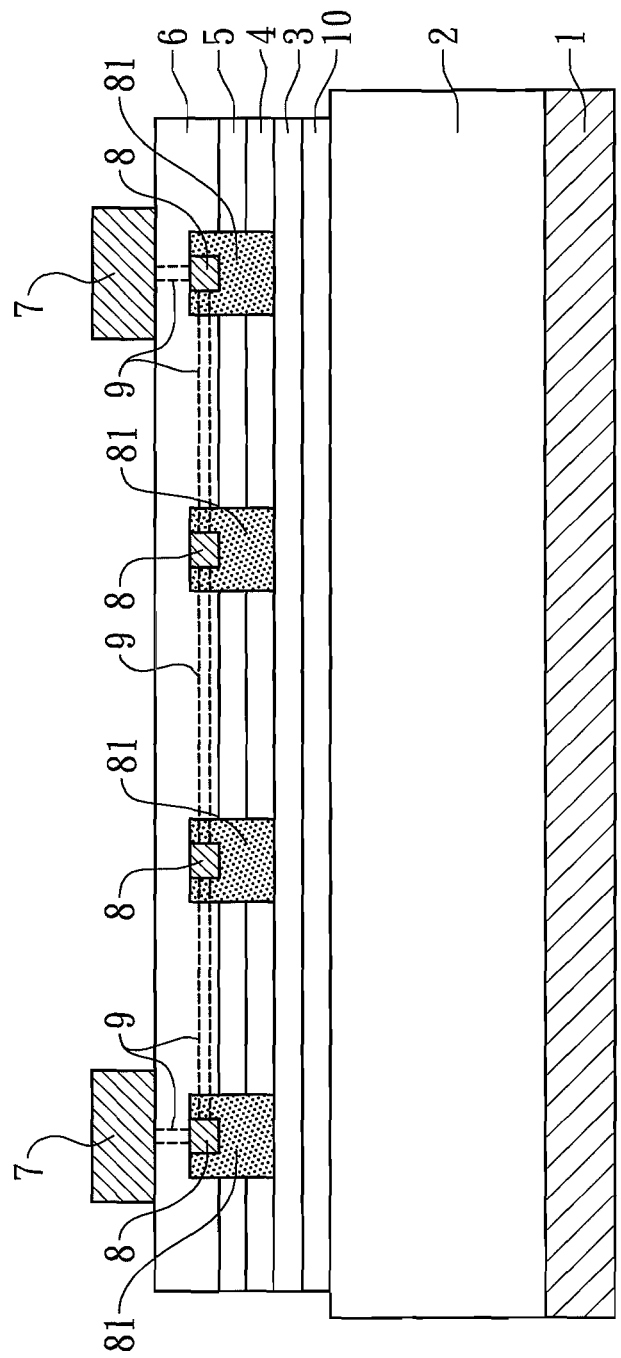
FIG. 3A is a cross-sectional view of another embodiment according to the present invention.

Referring to FIGS. 3 and 3A, the number of the second electrode 7 on the second electrical semiconductor layer 6 may also be designed to be smaller than that of the third electrode 8 under the second electrical semiconductor layer 6, and the total area of the second electrode 7 on the second electrical semiconductor layer 6 is smaller than that of the third electrode 8 under the second electrical semiconductor layer 6, which may also achieve the above objectives.

Therefore, according to the design of the present invention, the n-type semiconductor has a good conductivity, so the number of the metal electrodes is reduced to reduce the light shading and enhance the luminance. Therefore, in a preferred design of the present invention, the first electrical semiconductor layer 4 is of p-type and the second electrical semiconductor layer 6 is of n-type. Thus, after the second electrode 7 on the second electrical semiconductor layer 6 is electrically connected the third electrode 8 under the second electrical semiconductor layer 6 by means of the connection channel 9, the light-emitting area is greatly increased accordingly, and the lumen in a unit of area is increased, so the light-emitting efficiency is effectively improved to a great extent while maintaining a high light-emitting efficiency and luminance.

The embodiments and the technical means of the present invention have been disclosed above, and many alternations and modifications may be deduced according to the disclosure or teachings of the present invention. The equivalent changes within the scope of the present invention and the functions without departing the concept and spirit of the specification and drawings of the present invention should be regarded as falling within the technical scope of the present invention.

According to the above disclosure, the present invention provides the high luminous and high power LED capable of effectively improving lumen while maintaining a high light-emitting efficiency and can achieve the expected objectives and certainly has the industrial applicability and feasibility, so the present invention is proposed and applied for a patent according to law.

It should be understood that different modifications and variations could be made from the disclosures of the present invention by the people familiar in the art without departing the spirit of the present invention.

What is claimed is:

1. A light-emitting diode (LED), comprising:
   a first electrode;
   a metal conductive substrate, formed on the first electrode;
   a reflective layer formed on the metal conductive substrate;
   a first electrical semiconductor layer formed on the reflective layer;
   an active layer formed on the first electrical semiconductor layer;
   a second electrical semiconductor layer formed on the active layer; and
   at least one second electrode formed on a top surface of the second electrical semiconductor layer, for forming an ohmic contact with the second electrical semiconductor layer;
   wherein at least one third electrode is disposed on a bottom surface of the second electrical semiconductor layer and covered by the second electrical semiconductor layer for forming an ohmic contact with the second electrical semiconductor layer, and at least one connection channel penetrates through the second electrical semiconductor layer for electrically connecting the second electrode and the third electrode, and
   wherein a total area of the second electrode on the top surface of the second electrical semiconductor layer is smaller than a total area of the third electrode on the bottom surface of the second electrical semiconductor layer.

2. The LED according to claim 1, wherein a number of the second electrodes on the second electrical semiconductor layer and a number of the third electrodes on the bottom surface of the second electrical semiconductor layer are the same, each third electrode is correspondingly disposed right under each second electrode and at least one connection channel is disposed between the second electrode and the third electrode.

3. The LED according to claim 1, wherein a material of the metal conductive substrate is at least one selected from a group consisting of Cu, Al, Ni, Mo, Ti, Ag, Au, Co, Ta, W, Sn, In and an alloy thereof.

4. The LED according to claim 1, wherein a material of the active layer is at least one selected from a group consisting of AlInGaN, InGaN, GaN, AlGaInP, InGaP, GaAs, InGaAs, InP and AlGaAs.

5. The LED according to claim 1, wherein a material of the reflective layer is at least one selected from a group consisting of Ag, Al, Au, Rh, Pt, Cu, Ni, W, In, Pd, Zn, AlSi, Ni/Ag/Ni/Au, Ag/Ni/Au, Ag/Ti/Ni/Au, Ti/Al, Ni/Al, Ni/Ag and an alloy thereof.

6. The LED according to claim 1, wherein the first electrical semiconductor layer is of p-type and the second electrical semiconductor layer is of N-type.

7. A light-emitting diode (LED), comprising:
a first electrode;
a conductive substrate, formed on the first electrode;
a reflective layer, formed on the conductive substrate;
a bonding layer, disposed between the conductive substrate and the reflective layer;
a first electrical semiconductor layer, formed on the reflective layer;
an active layer, formed on the first electrical semiconductor layer;
a second electrical semiconductor layer, formed on the active layer;
at least one second electrode, formed on a top surface of the second electrical semiconductor layer for forming an ohmic contact with the second electrical semiconductor layer;
wherein at least one third electrode is disposed on a bottom surface of the second electrical semiconductor layer and covered by the second electrical semiconductor layer for forming an ohmic contact with the second electrical semiconductor layer, and at least one connection channel penetrates through the second electrical semiconductor layer for electrically connecting the second electrode and the third electrode, and
wherein a total area of the second electrode on the top surface of the second electrical semiconductor layer is smaller than a total area of the third electrode on the bottom surface of the second electrical semiconductor layer.

8. The LED according to claim 7, wherein a material of the conductive substrate is at least one selected from a group consisting of Cu, Al, Ni, Mo, W, Ti, Ag, Au, Co, Ta, Sn, In and an alloy thereof, or the material of the conductive substrate is at least one selected from a group consisting of Si, Ge, GaP, SiC, GaN, AlN, GaAs, InP, AlGaAs and ZnSe.

9. The LED according to claim 7, wherein a material of the active layer is at least one selected from a group consisting of AlInGaN, InGaN, GaN, AlGaInP, InGaP, GaAs, InGaAs, InP and AlGaAs.

10. The LED according to claim 7, wherein components of the bonding layer at least contain one of Au, AuIn and AuSn.

* * * * *